(12) United States Patent
Kirovski et al.

(10) Patent No.: US 6,907,516 B2
(45) Date of Patent: Jun. 14, 2005

(54) COMPRESSION OF PROGRAM INSTRUCTIONS USING ADVANCED SEQUENTIAL CORRELATION

(75) Inventors: Darko Kirovski, Bellevue, WA (US); Milenko Drinic, Los Angeles, CA (US); Hoi Huu Vo, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 558 days.

(21) Appl. No.: 10/159,857

(22) Filed: May 30, 2002

(65) Prior Publication Data

US 2003/0225997 A1 Dec. 4, 2003

(51) Int. Cl.[7] .............................................. G06F 9/00
(52) U.S. Cl. .................................................... 712/210
(58) Field of Search ......................... 707/101; 712/210

(56) References Cited

U.S. PATENT DOCUMENTS

| | | | | |
|---|---|---|---|---|
| 5,632,024 A | * | 5/1997 | Yajima et al. | 712/205 |
| 5,710,909 A | * | 1/1998 | Brown et al. | 711/170 |
| 5,805,932 A | * | 9/1998 | Kawashima et al. | 710/68 |
| 5,832,126 A | * | 11/1998 | Tanaka | 382/239 |
| 6,142,682 A | * | 11/2000 | Skogby | 703/26 |
| 6,412,066 B2 | * | 6/2002 | Worrell et al. | 712/229 |
| 6,618,728 B1 | * | 9/2003 | Rail | 707/101 |
| 6,624,761 B2 | * | 9/2003 | Fallon | 341/51 |
| 6,732,256 B2 | * | 5/2004 | Henkel et al. | 712/208 |
| 6,801,996 B2 | * | 10/2004 | Banno et al. | 712/210 |

* cited by examiner

Primary Examiner—Eric Coleman
(74) Attorney, Agent, or Firm—Workman Nydegger (57) ABSTRACT

Compressing program binaries with reduced compression ratios. One or several pre-processing acts are performed before performing compression using a local sequential correlation oriented compression technology such as PPM, or one of its variants or improvements. One pre-processing act splits the binaries into several substreams that have high local sequential correlation. Such splitting takes into consideration the correlation between common fields in different instructions as well as the correlation between different fields in the same instruction. Another pre-processing reschedules binary instructions to improve the degree of local sequential correlation without affecting dependencies between instructions. Yet another pre-processing act replaces common operation codes in the instruction with a symbols from a second alphabet, thereby distinguishing between operation codes that have a particular value, and other portions of the instruction that just happen to have the same value. Local sequential correlation compression such as PPM is then performed.

26 Claims, 6 Drawing Sheets

| UNCOMPRESSED FILE SIZE | BZIP2 | | PPMD | | PPMEXE | | IMPROVEMENT | |
|---|---|---|---|---|---|---|---|---|
| | SIZE | CR | SIZE | CR | SIZE | CR | PPMD [%] | BZIP2 [%] |
| 872588 | 447262 | 0.5126 | 416218 | 0.477 | 341764 | 0.3917 | 17.9 | 23.6 |
| 6137358 | 3479156 | 0.5669 | 3225381 | 0.5255 | 2622283 | 0.4273 | 18.7 | 24.6 |
| 7535800 | 4230772 | 0.5614 | 3919572 | 0.5201 | 3169802 | 0.4206 | 19.1 | 25.1 |
| 7303411 | 4107083 | 0.5624 | 3807300 | 0.5213 | 3078734 | 0.4215 | 19.1 | 25.0 |
| 4449093 | 2319060 | 0.5212 | 2140822 | 0.4812 | 1628358 | 0.366 | 23.9 | 29.8 |
| 3942060 | 2079498 | 0.5275 | 1919686 | 0.487 | 1532305 | 0.3887 | 20.2 | 26.3 |
| 3769781 | 2134632 | 0.5662 | 1976977 | 0.5244 | 1530841 | 0.4061 | 22.6 | 28.3 |
| 3941408 | 2266959 | 0.5752 | 2102326 | 0.5334 | 1642203 | 0.4167 | 21.9 | 27.6 |

COMPRESSION OF PROGRAM INSTRUCTIONS USING ADVANCED SEQUENTIAL CORRELATION

BACKGROUND OF THE INVENTION

1. The Field of the Invention

The present invention relates to compression technology. More specifically, the present invention relates to methods, systems and computer program products for performing compression of program binaries using an advanced form of sequential correlation.

2. Background and Relevant Art

Computing systems have revolutionized the way people work and play. Original computing systems were rather monolithic, stand-alone mainframe computing systems often occupying entire rooms despite their relatively low processing and memory capabilities by modern standards. Currently, however, a wide variety of computing systems are available that are often even more powerful than there much larger mainframe ancestors. For example, a computing system may include a desktop computer, a laptop computer, a Personal Digital Assistant (PDA), a mobile telephone, or any other system in which machine-readable instructions or "binaries" may be executed by one or more processors. Computers may even be networked together to allow information to be exchanged electronically even over large distances as when using the Internet.

Despite monumental advances in computing technology, computing systems still have limited memory resources and network bandwidth that will vary depending on the computing system. In order to preserve memory resources and network bandwidth, compression technology is often employed to reduce the size of files (or any other data segments such as programs or software modules) with minimal, if any, loss in information. While there are many varying compression technologies, all compression technologies reduce the size of a data segment by taking advantage of redundancies in the file. By reducing the size of the file, the memory needed to store the file and the bandwidth needed to transmit the file are both reduced. The power requirements for processing compressed files are also often reduced which is especially relevant to low power environments such as mobile devices.

Text is often compressed as the semantic and syntactic rules that structure the text also introduce a high degree of redundancy in the text. Patterns can be detected in such text that allow one to make reasonable guesses as to the text that follows based on the text that was just read. Skilled human readers with sufficient reading comprehension skills can, for example, often reasonably predict how a sentence will be completed before even reading the entire sentence. Such prediction would not be possible if the text was simply a random sequence of arbitrary text characters, following no syntactic or semantic rules.

Due to the predictability of text, text is said to have a high degree of local sequential correlation. That is, a human, and even a computer, can make reasonable predictions as to what text will follow, based on the immediately preceding text. One compression technology that takes advantage of the high degree of local sequential correlation in text is called Prediction by Partial Matching compression or "PPM" compression for short.

PPM compression, and its numerous variants and improvements, are well-known to one of ordinary skill in the art and thus will not be described herein in detail. However, the fundamentals of PPM compression are now described for context. A PPM engine receives an input data-stream to be compressed. As one might expect, the PPM compression process involves sophisticated mathematical manipulations. Accordingly, throughout this summary description of PPM compression, certain mathematical nomenclature is used to describe such mathematical manipulations. While the nomenclature is typically known to one of ordinary skill in the art, the nomenclature will be described in detail for clarity.

Let the input data-stream to be compressed be denoted as $x \in \{A\}^N$, where x is a sequence of N symbols from an alphabet A. In the case of a string of English text, for example, the alphabet A would might include characters that are used in English text. x is a specific string of characters from the designated alphabet. In the following discussion, a specific example string of "shareware" is often referred to although a typical string of text may be many thousands or even millions of characters long. In the example of the string "shareware", N would be nine since there are nine characters in the string "shareware".

A "context of order K" is defined as a sequence of K consecutive symbols of x. Let the i'th symbol of the string x be denoted as $x_i$. A context of order K for the symbol $x_i$ is the sequence of symbols $\{x_{i-K}$, through $x_{i-1}\}$. For example, for the example string "shareware", a context of order four of the character "w" is "hare". $P_c(s)$ denotes the probability that a character s follows a context C, where s belongs to the alphabet A.

While both compressing and decompressing, PPM builds a model of the input data-stream that aims at estimating the probability that a certain symbol occurs after a certain context. PPM encodes a symbol with the amount of information proportional to the probability that the symbol appears after its current context of a certain order. The maximum referenced context order is constant.

The PPM model has entries for each unique context that have occurred in the processed portion of the input data-stream. For example, suppose that the string "shareware" is processed with a maximum context of two. The order two contexts would be "sh", "ha", "ar, "re", "ew", and "wa". The order one contexts would be "s", "h", "a", "r", "e" and "w". An order zero context would also be present for processing purposes and may be considered the null set "".

The model counts the symbols that have occurred after each context in the processed data-stream. If a character has never been encountered before following a particular context, the count of an escape entry (as represented by a character "ϵ") is incremented by one. For the example string "shareware" with a maximum context of order two, the symbol "a" for the context "sh" would have a count of one. In other words, the symbol "a" only followed the two character string "sh" once. The escape count for the context "sh" would also be one since when the "a" was encounter after processing the text "sha", the "a" had never before occurred in the string following the characters "sh", and since no symbol other than "a" had ever followed the two character string "sh" in the example string "shareware". The following Table 1 illustrates the entries that would result from pure PPM after having processed the string "shareware" with a maximum context of two.

TABLE 1

| Context Order | Context | Following Symbol | Count | Escape ($\epsilon$) Count |
|---|---|---|---|---|
| 0 | "" | "s", "h", "a", "r", "e", "w" | 1, 1, 2, 2, 2, 1, respectively | 6 |
| 1 | "s" | "h" | 1 | 1 |
| 1 | "h" | "a" | 1 | 1 |
| 1 | "a" | "r" | 2 | 1 |
| 1 | "r" | "e" | 2 | 1 |
| 1 | "e" | "w" | 1 | 1 |
| 1 | "w" | "a" | 1 | 1 |
| 2 | "sh" | "a" | 1 | 1 |
| 2 | "ha" | "r" | 1 | 1 |
| 2 | "ar" | "e" | 2 | 1 |
| 2 | "re" | "w" | 1 | 1 |
| 2 | "ew" | "a" | 1 | 1 |
| 2 | "wa" | "r" | 1 | 1 |

If the string "shareware" were to continue, then a new entry would be added whenever a new symbol follows a particular context. If the context is not yet at the maximum context order, then a new context is created. Each new entry is initialized with a count field for the new symbol that created the context, as well as a count field for the escape character $\epsilon$ for the new context.

Note that each context of order one or two has an escape count of one since only one character follows each of the possible contexts. Accordingly, only one previously unencountered character was encountered for each context. Had the string been "shareware", however, the escape count for context "re" would have been two, since two different characters following the context "re" including "w" and "s".

If a symbol has occurred in the processed data stream, the probability of any symbol occurring given a particular context is given by the count of the symbol following the context as compared to the total count for all symbols following the context. For example, the context of order zero or the null set "" has a total count of fifteen including six for the escape character. The count for the symbol "r" following the context of order zero is two. Accordingly, the probability of the symbol "r" occurring given a context of order zero of "" is 2/15, which may be expressed as $P_0(r)=2/15$.

The current order is incremented by one if the current order is not yet the maximum allowable order, and if an already existing symbol was found after an existing context. The current order is decremented by one if a new symbol was found after an existing context.

A special context of order −1 contains all the symbols in the alphabet A that have not yet been encountered to that point in processing the input data-stream. From this context, the probability of occurrence is uniformly for all symbols that belong to the alphabet A. For example, if there are 100 symbols in the alphabet A, then the probability of any given character occurring before processing of the input data-stream is exactly one percent.

PPM uses arithmetic coding to encode predicted and escape symbols according to the probabilities of their occurrence after a certain context. The arithmetic coder converts an input data-stream of arbitrary length into a single rational number from zero to one, which range may be expressed as [0, 1]. In this description, a range from number a (inclusive) to number b (but excluding the number b) is denoted as [a, b}. A square bracket "[" or "]" indicates that the range goes to and includes the adjacently expressed number. A curled bracket "{" or "}" indicates that the ranges goes to, but does not include, the adjacently expressed number.

Now described is how the symbol "s" concatenated to "shareware" would be arithmetically coded assuming that that the previous symbols have already been encoded and the current range when coding the final "s" is reset to [0, 1]. The longest (order two) context for "s" is "re". According to the current PPM model, the probability of "w" occurring after context "re" is the same as the probability of an escape character "$\epsilon$" occurring after context "re". In the arithmetic language previously set forth, $P_{re}(W)=P_{re}(\epsilon)=\frac{1}{2}$. The arithmetic coder thus divides the range [0, 1] into two subranges [0, 0.5} and [0.5, 1}, each representing "w" and "$\epsilon$" respectively.

Since "s" has not been previously recorded after context "re", the order two context is decremented to the corresponding order one context for "s". In this case, that order one context is "e". Also, the escape symbol $\epsilon$ is emitted by limiting output range to [0.5, 1]. Since $P_e(w)=P_e(\epsilon)=\frac{1}{2}$, the arithmetic decoder further divides the range to [0.5, 0.75} and [0.75, 1} for "w" and "$\epsilon$", respectively. Since "s" has never occurred after order one context "e" either, the current context is decremented by one to be an order zero context "". Also, the escape character $\epsilon$ is emitted by shrinking the range to [0.75, 1}.

The order zero context "" contains seven symbols, including "s". Accordingly, the range is divided into seven ranges corresponding to each of the seven ranges. The size of each of the seven ranges is proportional to the probability of occurrence for each of the seven ranges. Accordingly, the ranges may be assigned for order zero context "" as shown in the following Table 2.

TABLE 2

| Symbol | Probability | Range |
|---|---|---|
| "s" | 1/15 | [0.75, 0.7667} |
| "h" | 1/15 | [0.7667, 0.7833} |
| "a" | 2/15 | [0.7833, 0.8167} |
| "r" | 2/15 | [0.8167, 0.85} |
| "e" | 2/15 | [0.85, 0.8833} |
| "w" | 1/15 | [0.8833, 0.9} |
| "$\epsilon$" | 6/15 | [0.9, 1} |

To encode "s", the arithmetic coder reduces the range to [0.75, 0.7667}. If "s" was the last symbol to be encoded, the arithmetic coder would output a result of the compression any number in the range [0.75, 0.7667}. Given the starting PPM model, any number within [0.75, 0.7667} uniquely identifies the symbol "s" at the decoder. After processing a symbol, the PPM model is updated. For example, referring to Table 1, having processed "s" after context "re" would result in a new entry of "s" after context "re". Similarly, having processed "s" after context "e" would result in a new entry of "s" after context "e". Having processed "s" after context "" would result in the count for "s" for the context "" being incremented by one. In sum, Table 1 would be altered as shown in Table 3.

TABLE 3

| Context Order | Context | Following Symbol | Count | Escape ($\epsilon$) Count |
|---|---|---|---|---|
| 0 | "" | "s", "h", "a", "r", "e", "w" | 2*, 1, 2, 2, 2, 1, respectively | 6 |
| 1 | "s" | "h" | 1 | 1 |

TABLE 3-continued

| Context Order | Context | Following Symbol | Count | Escape (ϵ) Count |
|---|---|---|---|---|
| 1 | "h" | "a" | 1 | 1 |
| 1 | "a" | "r" | 2 | 1 |
| 1 | "r" | "e" | 2 | 1 |
| 1 | "e" | "w", "s"* | 1, 1*, respectively | 1 |
| 1 | "w" | "a" | 1 | 1 |
| 2 | "sh" | "a" | 1 | 1 |
| 2 | "ha" | "r" | 1 | 1 |
| 2 | "ar" | "e" | 2 | 1 |
| 2 | "re" | "w", "s"* | 1, 1*, respectively | 1 |
| 2 | "ew" | "a" | 1 | 1 |
| 2 | "wa" | "r" | 1 | 1 |

(The asterisk symbol * identifies portions where Table 3 has changed from Table 1)

The arithmetic coder iteratively reduces its operating range until the leading digets of the high and low bound are equal. Then, the leading digit may be transmitted. In the above example where the range was [0.75, 0.7667}, the digit 7 may be transmitted and the updated range becomes [0.5, 0.6667}. This process is often referred to as "normalization" and allows compression of files of any length on limited precision arithmetic coders. The PPM compression process is fully invertible with the PPM decompression process. In other words, the decoder need only repeat the coding process description above to arrive at the correct string of text. The only caution is that the same version of PPM used to compress must be the same version of PPM used to decompress. If different, even slightly, decompression would almost certainly be unsuccessful.

A number of PPM variants have been developed as an improvement to the original PPM algorithm described above. One difference is how the escape symbols ϵ probabilities are calculated. For example, one variant fixes the count of escape symbols ϵ to one for any given context. Another only increments the escape count by one half when encountering a previously unencountered symbol for a given context. Other variants include the calculation of escape probabilities using heuristics that account for the number of symbols that occurred in a given context. One standard improvement to PPM called "exclusion" assumes that only the context where the symbol is found as well as higher order contexts are updated in the PPM model.

PPM uses local sequential correlation to perform its predictions. Hereinafter, unless specifically limited, "PPM" refers to the original PPM described in some detail above, along with all of its variants and improvements including those referred to above, as well as other variants derived from the original PPM compression technology. Due to its heavy emphasis on local sequential correlation, and due to the local sequential correlation inherent in text that follows specific syntactic and semantic rules, PPM is heavily used to compress text files.

PPM is also used to compress program binaries. As used herein, "program binaries" mean a sequence of machine-level executable instructions. As is apparent from the above description of PPM, PPM exclusively explores the localized correlations in one-dimensional neighborhoods of the input data-stream. For example, PPM uses context that are adjacently preceding the currently evaluated symbol.

Program binaries are structured somewhat different than text. Text may be conceived as a stream of conversation flowing in one direction. Program binaries may be conceived as a vertical list of instructions. Program binaries have some degree of local sequential correlation within a single instruction. This local sequential correlation is referred to herein as "horizontal correlation". However, program binaries also have correlation between similar fields in different instructions. That correlation is referred to herein as "vertical correlation". PPM is well-suited for taking advantage of the horizontal correlation, but is not well-suited for taking advantage of the vertical correlation present in a sequential list of program binaries.

In order to conserve memory resources and network bandwidth, it is desirable to compress files that are to be stored and transmitted as much as possible. This is true of executable files and other sequences of program binaries. Accordingly, what is desired are methods, systems, and computer program product for performing more efficient compression of program binaries than that allowed by compression mechanisms that take advantage of horizontal correlation alone.

BRIEF SUMMARY OF THE INVENTION

The foregoing problems with the prior state of the art are overcome by the principles of the present invention, which are directed towards methods, systems and computer program products for compressing computer-executable instructions such as binary machine-executable instructions or "binaries", as well as intermediate formats such as assembly language, and even including source code. In particular, the compression method explores the syntax and semantic similarities present within each instruction (called herein horizontal correlation), as well as such similarities present within common fields of consecutive instructions (called herein vertical correlation).

The compression method uses local sequential correlation compression technologies such as, for example, PPM or variants and improvements thereof such as those well known in the art (e.g., PPMD or PPMC) as well as possible improvements yet to be developed. Before performing local sequential correlation compression, the compression invokes one or more unique pre-processing acts.

One pre-processing act splits the sequential list of executable instructions to improve the level of local horizontal correlation present in each stream. One conventional way to do this is to split the instruction into its component fields (e.g., operation code, prefix, operand, etc.) and place all the fields of a common type into a single stream to be compressed. Common types of fields tend to have a high level of vertical correlation. By combining just the common field types into a single stream, the vertical correlation is transformed into horizontal correlation, which is more suitable for local sequential correlation compression mechanisms such as PPMD.

This conventional method of splitting a sequence of computer-executable instructions reduces compression rates. However, the horizontal correlation that was present between fields of any given instruction is lost since the fields within that common instruction may now be in separate streams. The present invention splits the sequence of computer-executable instructions in a more sophisticated way balancing the horizontal and vertical correlation between instruction fields. The splitting pre-processing also takes into consideration the fundamental trade-off between compression ratios and the size of the sub-stream being compressed. The result of the splitting pre-processing is that a number of sub-stream portions are extracted from the sequence of binaries leaving a remaining portion which is called herein a "core" sub-stream.

Another possible pre-processing act involves reordering the sequence of instructions without changing the functionality of the sequence of instructions. This is done by reordering the instructions in such a way that functional dependencies between instructions are not lost. This instruction rescheduling may be performed regardless of whether the sequence of instructions has also undergone instruction splitting. However, if instruction splitting has been performed, the instruction rescheduling is performed consistently in the core sub-stream and in the extracted sub-streams.

Once one or both of the instruction splitting and rescheduling pre-processing acts are performed, the potentially reordered sequence of instructions is compressed either as a whole or as a group of sub-streams. Since the pre-processing steps improves the local sequential correlation in each of the sub-streams, compression rates are reduced when using local sequential correlation compression methods such as PPM and PPMD.

As an additional improvement, the compression method may use a dual alphabet to represent a binary stream that is ready for compression. In particular, a regular alphabet of symbols is used to compress each possible 8-bit value present in the binary instructions. In addition, the most commonly appearing core instructions are each assigned a unique symbol from a second alphabet, the symbol replacing the core instruction in the sequence of instructions. This improves correlation as different symbols are used for core instructions having particular values, and for values when those values appear outside of a core instructions. This further improves local sequential correlation.

Accordingly, the principles of the present invention allow for improved, reduced compression rates when compressing program binaries. This reduces the memory and bandwidth requirements associated with processing the program binaries. Compression technology may be implemented in many different computing environments. Even a minor improvement in compression technology provides significant memory and bandwidth savings. The present invention provides a significant improvement in the compression ratio as compared to conventional methods for compressing binary. Accordingly, the principles of the present invention offer a significant advancement in the state of the art.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention extends to methods, systems and computer program products for compressing program binaries with reduced compression ratios. One or several pre-processing acts are performed before performing compression using a local sequential correlation oriented compression technology such as PPM, or one of its variants or improvements.

One pre-processing act is called instruction splitting in which the binaries to be compressed are split into several substreams that have high local sequential correlation. Such splitting takes into consideration the correlation between common fields in different instructions (called herein "vertical correlation") as well as the correlation between different fields in the same instruction (called herein "horizontal correlation").

Another pre-processing act is called instruction rescheduling in which instructions are rescheduled to improve the degree of local sequential correlation. Such scheduling occurs without affecting dependencies between instructions, and thus without affecting the functionality of the binaries.

Yet another pre-processing act replaces common operation codes in the instruction with a symbols from a second alphabet, thereby distinguishing between operation codes that have a particular value, and other portions of the instruction that just happen to have the same value.

Embodiments within the scope of the present invention include computer-readable media for carrying or having computer-executable instructions or data structures stored thereon. Such computer-readable media can be any available media which can be accessed by a general purpose or special purpose computer. By way of example, and not limitation, such computer-readable media can comprise physical computer-readable media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer.

When information is transferred or provided over a network or another communications connection (either hardwired, wireless, or a combination of hardwired or wireless) to a computer, the computer properly views the connection as a computer-readable medium. Thus, any such a connection is properly termed a computer-readable medium. Combinations of the above should also be included within the scope of computer-readable media. Computer-executable instructions comprise, for example, any instructions and data which cause a general purpose computer, special purpose computer, or special purpose processing device to perform a certain function or group of functions. The computer-executable instruction may be, for example, binaries, intermediate format instructions such as assembly language, or even source code.

Figure 1:
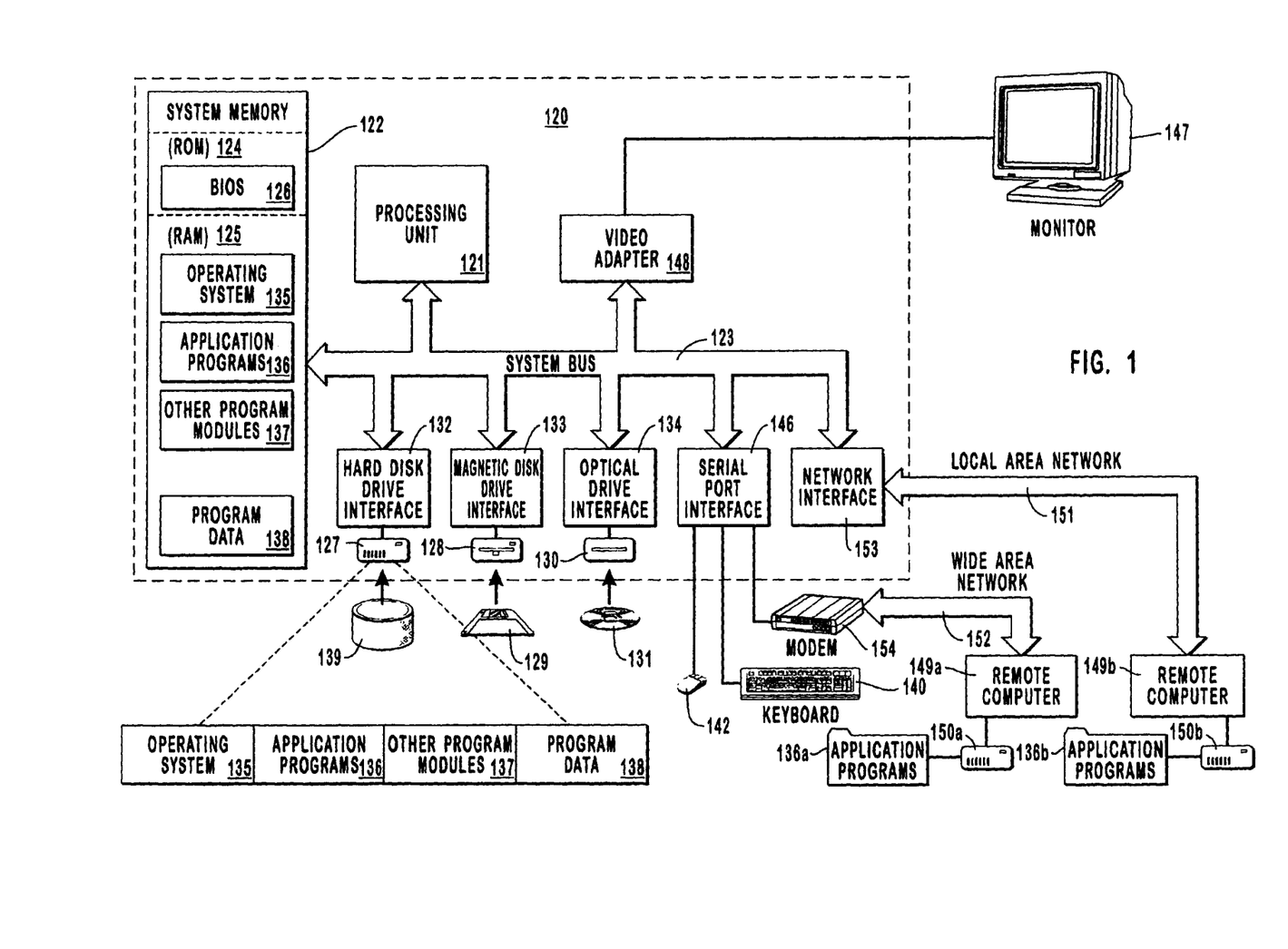
FIG. 1 illustrates a suitable operating environment for the principles of the present invention.

FIG. 1 and the following discussion are intended to provide a brief, general description of a suitable computing environment in which the invention may be implemented. Although not required, the invention will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those skilled in the art will appreciate that the invention may be practiced in network computing environments with many types of computer system configurations, including personal computers, hand-held devices, multi-processor systems, microprocessor-based or programmable consumer electronics, network PCs, minicomputers, mainframe computers, and the like. The invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

With reference to FIG. 1, an exemplary system for implementing the invention includes a general purpose computing device in the form of a conventional computer 120, including a processing unit 121, a system memory 122, and a system bus 123 that couples various system components including the system memory 122 to the processing unit 121. The system bus 123 may be any of several types of bus structures including a memory bus or memory controller, a peripheral bus, and a local bus using any of a variety of bus architectures. The system memory includes read only memory (ROM) 124 and random access memory (RAM) 125. A basic input/output system (BIOS) 126, containing the basic routines that help transfer information between elements within the computer 120, such as during start-up, may be stored in ROM 124.

The computer 120 may also include a magnetic hard disk drive 127 for reading from and writing to a magnetic hard disk 139, a magnetic disk drive 128 for reading from or writing to a removable magnetic disk 129, and an optical disk drive 130 for reading from or writing to removable optical disk 131 such as a CD-ROM or other optical media. The magnetic hard disk drive 127, magnetic disk drive 128, and optical disk drive 130 are connected to the system bus 123 by a hard disk drive interface 132, a magnetic disk drive-interface 133, and an optical drive interface 134, respectively. The drives and their associated computer-readable media provide nonvolatile storage of computer-executable instructions, data structures, program modules and other data for the computer 120. Although the exemplary environment described herein employs a magnetic hard disk 139, a removable magnetic disk 129 and a removable optical disk 131, other types of computer readable media for storing data can be used, including magnetic cassettes, flash memory cards, digital video disks, Bernoulli cartridges, RAMs, ROMs, and the like.

Program code means comprising one or more program modules may be stored on the hard disk 139, magnetic disk 129, optical disk 131, ROM 124 or RAM 125, including an operating system 135, one or more application programs 136, other program modules 137, and program data 138. A user may enter commands and information into the computer 120 through keyboard 140, pointing device 142, or other input devices (not shown), such as a microphone, joy stick, game pad, satellite dish, scanner, or the like. These and other input devices are often connected to the processing unit 121 through a serial port interface 46 coupled to system bus 123. Alternatively, the input devices may be connected by other interfaces, such as a parallel port, a game port or a universal serial bus (USB). A monitor 147 or another display device is also connected to system bus 123 via an interface, such as video adapter 148. In addition to the monitor, personal computers typically include other peripheral output devices (not shown), such as speakers and printers.

The computer 120 may operate in a networked environment using logical connections to one or more remote computers, such as remote computers 149a and 149b. Remote computers 149a and 149b may each be another personal computer, a server, a router, a network PC, a peer device or other common network node, and typically include many or all of the elements described above relative to the computer 120, although only memory storage devices 150a and 150b and their associated application programs 136a and 136b have been illustrated in FIG. 1. The logical connections depicted in FIG. 1 include a local area network (LAN) 151 and a wide area network (WAN) 152 that are presented here by way of example and not limitation. Such networking environments are commonplace in office-wide or enterprise-wide computer networks, intranets and the Internet.

When used in a LAN networking environment, the computer 120 is connected to the local network 151 through a network interface or adapter 153. When used in a WAN networking environment, the computer 120 may include a modem 154, a wireless link, or other means for establishing communications over the wide area network 152, such as the Internet. The modem 154, which may be internal or external, is connected to the system bus 123 via the serial port interface 146. In a networked environment, program modules depicted relative to the computer 120, or portions thereof, may be stored in the remote memory storage device. It will be appreciated that the network connections shown are exemplary and other means of establishing communications over wide area network 152 may be used.

In accordance with the principles of the present invention, a sequential listing of computer-executable instructions may be access by a computer such as the computer 120 illustrated and described with respect to FIG. 1. While a specific example is provided below in which a binary list of computer-executable instructions is compressed and decompressed, one or ordinary skill in the art will recognize after having reviewed this description that the principles of the present invention may be employed to compress and decompress intermediate format instructions as well as source code. The only material difference from the binary list described below is that symbols would be used to represent components of the intermediate format or source code instructions, rather than components of the binary list.

Figure 2:
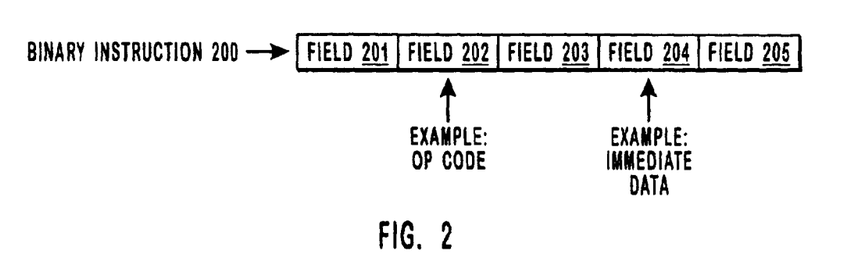
FIG. 2 illustrates the structure of a binary instruction.

FIG. 2 illustrates a general structure of such a binary instruction in the form of binary instruction 200. Each binary instruction may be read by a processor such as processing unit 121, thereby causing the processor to perform one or more operations as dictated by the binary instruction. Each of the application programs 136 and the other program modules 137 may be a sequence of such binary instructions. Complex software programs are quite large and may potentially be comprised of a sequence of many millions of binary instructions.

Binary instructions are structurally composed of several fields of information. The types of fields and their allowed values are dictated by standards called instruction sets. One common type of instruction set is the X86 instruction set although many instruction sets are commonly used. The principles of the present invention improve compression rates regardless of the type of instruction set as will be described in further detail below. In the illustrated binary instruction 200 of FIG. 2, the binary instruction contains fields 201 through 205. An example of a field would be an "op code" which describes the general operation to be performed (e.g., add, subtract, move, jump, among many others). Another example of a field would be an "immediate data" field that contains data that may be operated upon without reading any further data from memory.

One pre-processing act in accordance with the present invention involves splitting the instruction into portions that have high local sequential correlation, to thereby improve the compression rate when subsequently performing compression, such as PPM or PPMD, that is based on local sequential correlation. One conventional splitting mechanism involved simply separating off particular fields uniformly across all instructions, and separately compressing those particular fields as a separate compressible entity. Some fields, such as the immediate data field in the X86 instruction set, have high correlation. For example, the field values of the immediate data field are very often zero, plus one, or minus one. Due to this high degree of vertical correlation (i.e., correlation between common fields in different instruction binaries), splitting the binary list uniformly by field type does improve compression rates.

However, by splitting the binary list uniformly, there is some horizontal correlation (e.g., correlation between fields in a single instruction binary) that is lost. As an example, consider the X86 instruction code "Add ESP". When one encounters this instruction code, the value of the immediate data is often zero or four. Accordingly, there is a high degree of correlation between an instruction code of Add ESP and an immediate data of zero or four. If one were to simply split the immediate data fields uniformly off of all of the instructions, this horizontal correlation would be lost.

The principles of the present invention improve compression rates by splitting fields from the binary list without requiring uniform splitting of that particular field across all instruction binaries. In particular, the principles of the present invention balances the degree of vertical correlation with the degree of horizontal correlation in determining whether of not to split a particular field from a particular instruction. A field may be split from an instruction if the vertical correlation between the same field in different instructions is greater that the horizontal correlation between that field and the other fields in the same instruction binary. Accordingly, in the example of the immediate data in the X86 instruction set, the immediate data field may be split from all instructions except where the instruction code is "Add ESP" in which case the horizontal correlation is greater than the vertical correlation.

Figure 3:
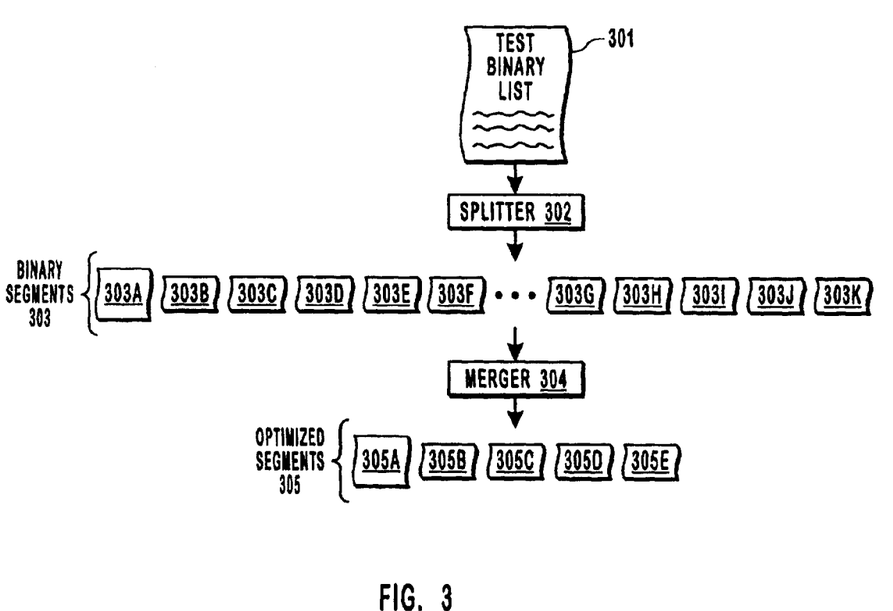
FIG. 3 illustrates several logical flows involved in splitting a test binary list.

FIG. 3 illustrates a general information flow involved with performing field splitting to improve compression rates. The computer 120 first accesses a test binary list 301. Then, a splitter 302 divides the test binary list 301 into multiple segments 303. The multiple segments may include, for example, particular fields of instructions having particular instruction codes. For example, one segment may include the 8-bit immediate data fields from the Add ESP instruction code, another may include the 8-bit immediate data fields from a SUB instruction code, another may include the 32-bit immediate data fields from particular instruction codes, or the like. The important thing about splitting is that the fields split into a common binary segment should have high correlation with each other. How the binary list should be initially split will depend on the instruction set that the binary list follows, as correlations between fields are often determined by the instruction set.

In the illustrated example of FIG. 3, the split binary list includes several binary segments 303B through 303K as well as a remainder segment 303A that includes the instruction codes and represents the resulting binary list after the segments 303B through 303K are stripped from the binary list 301.

The various binary segments 303 are then merged using merger 304 into a lesser number of segments 305. In general, merging of binary segments 303 occurs so long as the merging operation generally reduces the size of the compressed file. More specifically, this may be accomplished by starting with a particular number of segments. Then, the two segments that result in the most compression improvement when merged are, in fact, merged. In so doing, each two pair segment combination is compared to determine how the compressed size of the two segments if merged would compare to the compressed size of the two segments if compressed separately. If the two segment pair results in the best compression improvement of all two segment pairs, then merging is performed to thereby reduce the number of segments by one.

This process is repeated until desired. For example, the process may be repeated until the segments are reduced to a particular number. In the illustrated example, the optimized segments 305 include the remainder portion 305A, which is the same as the remainder portion 303A, except with potentially one or more of segments 303B through 303K merged therewith. The optimized segments 305 also include portions 305B through 305E, which represent a merged form of one or more of the segments 303B through 303K.

This merging operation is quite computationally intensive. Accordingly, the splitting and merging illustrated with respect to Figure may be performed perhaps only once for each instruction set, where the test binary list 301 represents an actual operational program that follows that instruction set. Generally speaking, optimized segments 305 represent a template that defines how any binary list that follows the instruction set should be divided, perhaps even non-uniformly, across instructions to improve compression rates. This template information may be provided to a disassembler and to an assembler that will be assisting in the compression and decompression, respectively. Accordingly, once the instruction set has been determined (either via a default setting or by some express indicator), the appropriate template for assembling and disassembling the binary list may be determined.

Figure 4:
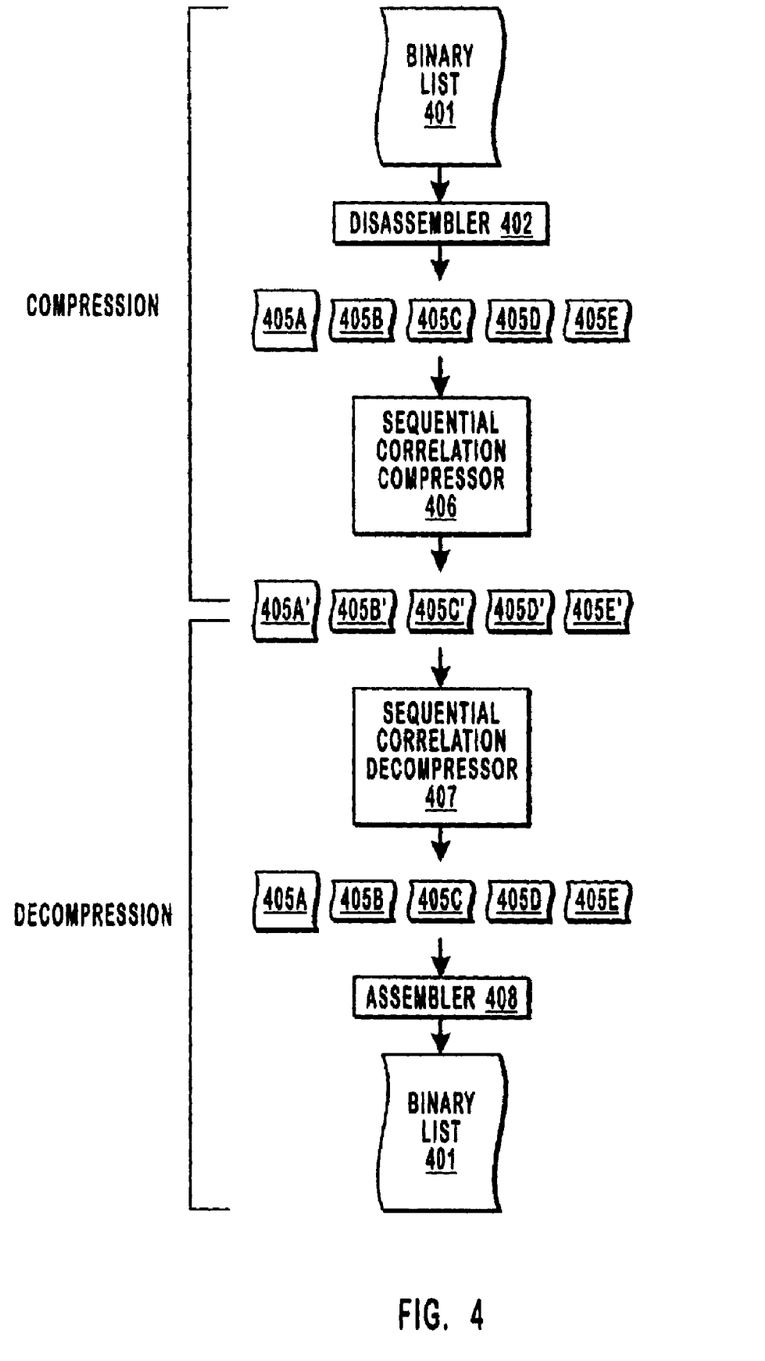
FIG. 4 illustrates several logic flows involved in compressing and decompressing a binary list having the same instructions set as the text binary list.

FIG. 4 illustrates a process of compressing a binary list to improve compression rates in accordance with the present invention. The compression process is illustrated in the top half of FIG. 4 to the right of the brackets labeled "COMPRESSION". The decompression process is illustrated in the bottom half of FIG. 4 to the right of the brackets labeled "DECOMPRESSION".

The computer that performs the compression accesses a binary list. The computer compression may be the same computer that generated the optimum splitting template in FIG. 3. However, one advantage of the present invention is that once the optimum splitting template has been determined in FIG. 3 for a particular instruction set, any computing system may then be informed of the splitting mechanism. Then, those other computing systems may perform the compression and decompression.

Referring to FIG. 4 during compression, the computer accesses the sequential binary list 401. Then, a disassembler 402 extracts a number of segments from the binary list 401 including, for example, segments 404B through 404E, which leaves a remainder segment 405A. This extraction process was performed by the disassembler 402 in accordance with the splitting template previously determined for that instruction set prior to compression time.

A sequential correlation compressor 406 then compresses each of the segments 405A through 405E using local sequential correlation compression mechanisms such as, for example, PPM, bzip2, and virtually any other compression mechanisms. The resulting compressed segments are illustrated as segments 405A' through 405E'.

During decompression, a sequential correlation compressor 407 then decompresses each of the compressed segments 405A' through 405E' using the inverse algorithm of the compression algorithm. In the case of the compression algorithm being PPM, the decompression algorithm would also be PPM since PPM is a fully invertible process. The decompressed segments are illustrated as segments 405A through 405E that are listed below the sequential correlation decompressor 407. These segments are then fed to an assembler 408, which reassembles the components segments using the inverse rules as were used to disassemble. The resulting binary list is illustrated on the bottom of FIG. 4 as binary list 401. The binary list is thereby reconstructed properly.

Having now described one of three potential pre-processing acts that are in accordance with the principles of the present invention (namely, instruction splitting), the second of the three potential pre-processing acts will now be described. The second pre-processing act is called "instruction rescheduling" in which instructions are rescheduled in order to reduce the entropy of the instruction list with respect to how compression algorithm sees the instruction list. This is a difficult, if not impossible problem to solve. The instructions are rescheduled so as not to change the functionality of the instructions. In other words, functional dependencies between instructions are preserved.

The instruction rescheduling may be performed after the instruction splitting pre-processing act described above. However, the instruction rescheduling may be performed before instruction splitting, or perhaps without even performing instruction splitting at all. If instruction splitting has already been performed, then the instruction rescheduling may be performed on the remainder segment of the binary list, with the rescheduling being propagated to the other segments that were split off.

As previously mentioned, instructions may be rescheduled so long as dependencies between instructions are preserved. If there are no dependencies between two instructions, those instructions may be swapped without affecting the functionality of the two instructions. For example, suppose there are two consecutive instructions, the first representing the function A=1+2, and the second representing the function D=A+3. These instructions cannot be swapped without changing the functioning of the two instructions. Without the swapping, A would be assigned a value of 3 and then D, relying on that value for A, will be assigned a value of 6. However, if the instructions are swapped, D will be equal to 3 plus whatever value happens to be assigned to A, if any value is assigned to A at all. Then, after D is already determined, A will be determined to have a value of 3. Accordingly, when swapping, a different result is obtained as compared to the original instruction sequence. Rescheduling of instructions may be performed without affecting the performance of the sequential list of program binaries so long as these dependencies are not broken.

The instruction rescheduling first determines a reordered sequence of instructions that perform identical operations as the original sequence of instructions, and which results in a smaller compression ratio when performing local sequential correlation compression. Now described are three methods for determining a reordered sequence of instructions.

A first method is referred to herein as the "basic block" method. In the basic block method, in order to limit the complexity of the rescheduling pre-processing act, the binary list may be divided into basic blocks within which instructions from that basic block may be rescheduled so long as dependencies are preserved. An example basic block includes the following seven X86 instructions:

1) mov esi, [eax+8]

2) mov ecx, [esp+1Ch]

3) mov edx, [eax+4]

4) or esi, 100h 5) cmp ecx, edx 6) mov [eax+8], esi 7) je LOOP

The following Table 4 illustrates how these instructions may be rescheduled without breaking pre-existing dependencies in this basic block:

TABLE 4

| Original Position | Instructions | Possible Position | | | | | | |
|---|---|---|---|---|---|---|---|---|
| | | 1 | 2 | 3 | 4 | 5 | 6 | 7 |
| 1 | mov esi, [eax + 8] | O | X | X | * | | | |
| 2 | mov ecx, [esp + 1 Ch] | X | O | X | X | * | | |
| 3 | mov edx, [eax + 4] | X | X | O | X | * | | |
| 4 | or esi, 100 h | | X | X | O | X | | |
| 5 | cmp ecx, edx | | | * | X | O | X | |
| 6 | mov [eax + 8], esi | | | * | * | X | O | |
| 7 | je LOOP | | | | | | | O |

In this table. an "O" represents the original position that the instructions appears in and thus inherently is one possible position for the instruction. An "X" represents a position to which the instruction may be moved without affecting dependencies. An "*" represents a possible position if at least one other instruction is moved as well.

When performing PPM, the instructions are rescheduled within a basic block so as to minimize the number of escape characters "ϵ" that are generated starting from its current model that was generated to that point in compression. In other words, the instruction are rescheduled so as to minimize the occurrence of new instructions following a given context of instructions. This rescheduling improves the local sequential correlation between instructions to thereby further improve compression ratios.

Figure 5:
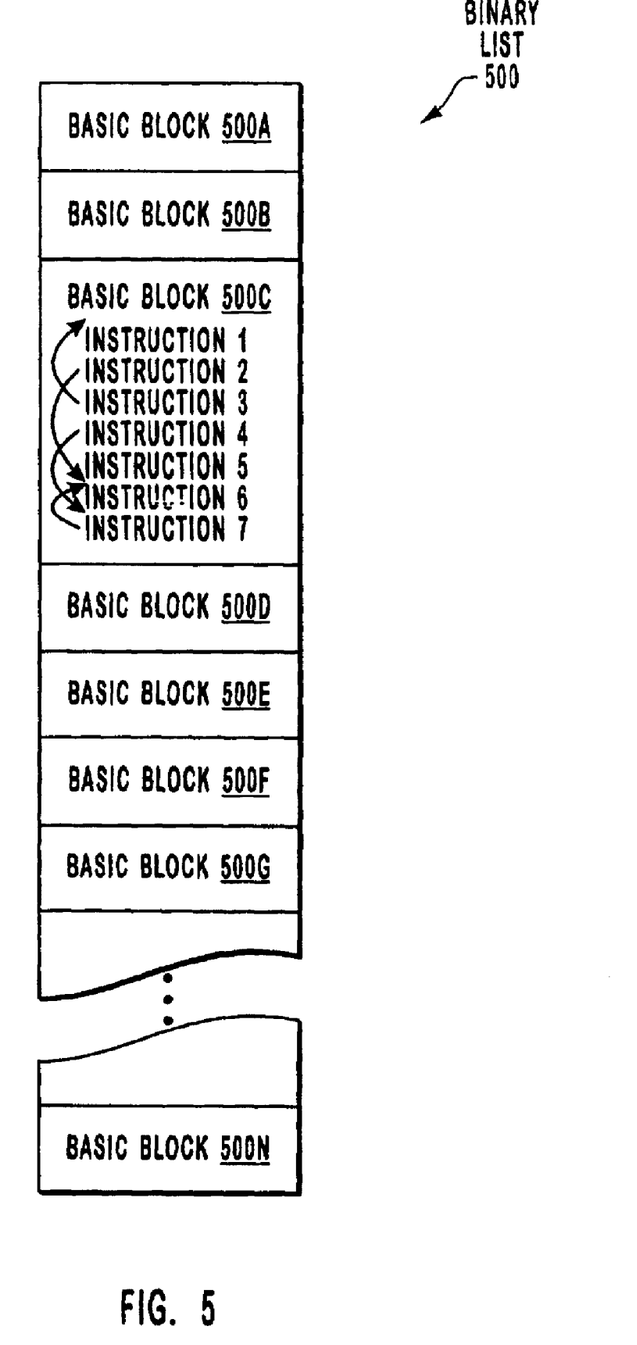
FIG. 5 illustrates a binary list divided into several basic blocks within which instruction scheduling may occur.

FIG. 5 illustrates a binary list 500 of binary instructions that is divided into several basic blocks 500A through 500N. The rescheduling of seven instructions within a basic block 500C is illustrated although similar rescheduling may be performed on the other basic blocks as well. Although the number of instructions in the basic block is illustrated as being seven for convenience in describing the principles of the invention, the size of the basic block may be different as desired with the caution that the larger the basic block, the more processing needed to perform the rescheduling pre-processing act described herein. A basic block may, for example, be in the range of from 10 to 15 core instructions. However, as processing capacity increases and depending on the size of the binary list to be compressed, the desired size of the basic block may differ.

A second way of determining a reordered sequence of instructions will be referred to herein as the "order one" method. In the order one method, the unique set of core instructions is first identified. This set of unique core instructions will be represented by the alphabet A. The symbol L denotes the cardinality (i.e., the number of basic elements) of the alphabet A. Also denoted herein is a dependency set $D(x)$, which is a set of instruction pairs. A pair $d(i, j)$ is the i'th and j'th instructions $x_i$ and $X_j$ in the executable list. The dependency set $D(x)$ includes all possible instructions pairs $d(i,j)$ in the executable list such that the instruction $x_i$ can be rescheduled to immediately precede instruction $x_j$ with functional dependencies of the executable list being preserved.

The order-one method improves context matching at the global level (i.e., throughout the entire executable list without using basic blocks) by maximizing the number of most frequent symbol-to-symbol occurrences throughout the entire binary. The order-one method iteratively performs two acts.

Figure 8:
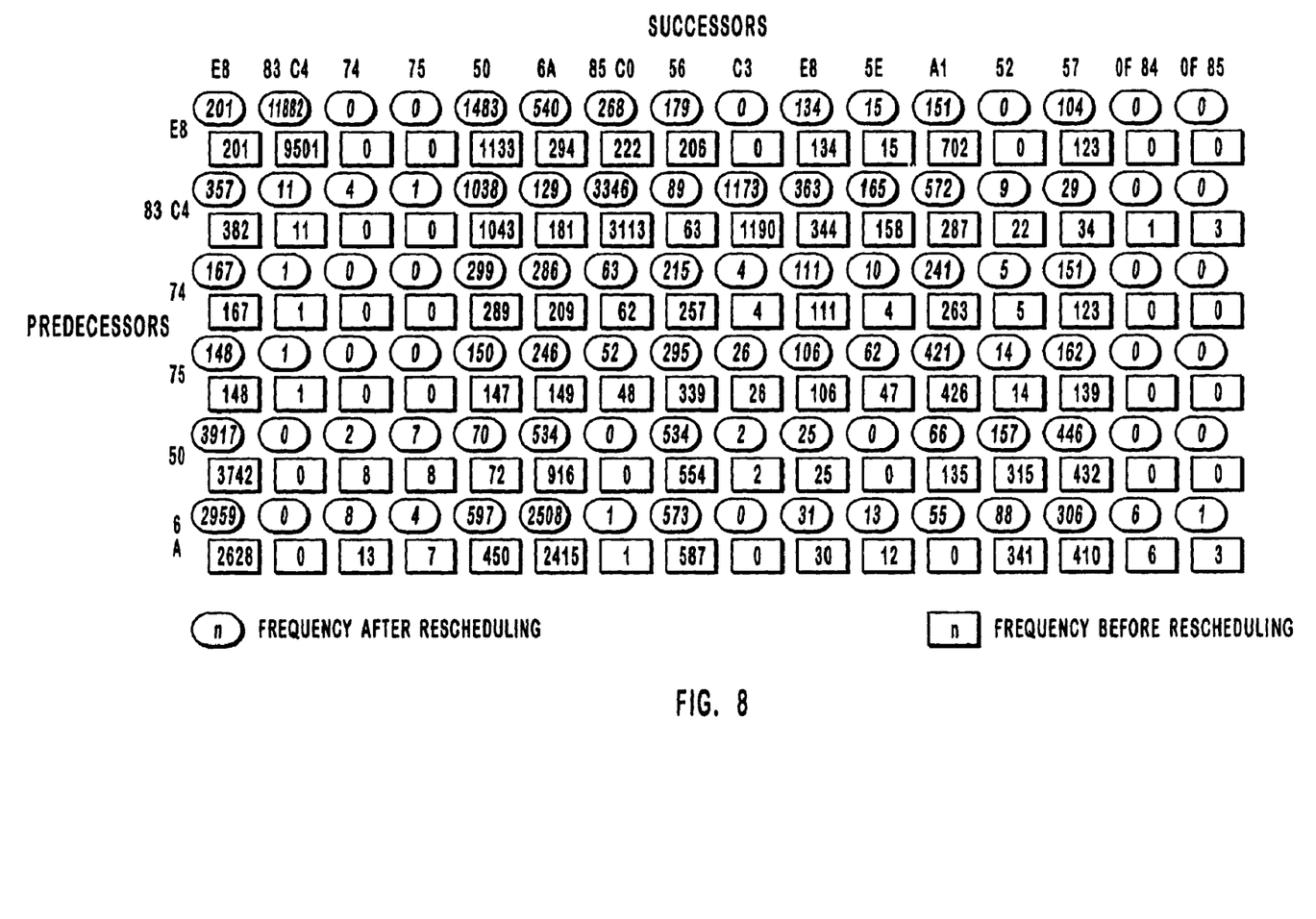
FIG. 8 illustrates an example connectivity matrix with counts both before performing the order-one rescheduling method, and after having performed several iterations of the order-one rescheduling method.

The first act is to compute a connectivity matrix of the executable list x. The connectivity matrix is represented herein as $M=\{I\}^{L \times L}$. The connectivity matrix M is a matrix of non-negative integer elements $m(i, j)$. The element $m(i, j)$ equals the count of all pairs $d(k,l)$ of the dependency set $D(x)$ such that the k'th instruction $x_k$ in the instruction set is the i'th symbol $a_i$ in the alphabet A, and such that the l'th instruction $x_l$ in the instruction set is the j'th symbol $a_j$, in the alphabet A, and where the i'th symbol $a_i$ and the j'th symbol $a_j$, may, in fact, be the same symbol. An example of the format of this connectivity matrix M is illustrated in FIG. 8.

In the second act, the order-one method finds the largest element $m(i, j)$ of the connectivity matrix M. The order-one method M then reorders instructions such that the count of all concatenated symbols $x_k x_{k+1}$ with values $x_k=a_i$ and $x_{k+1}=a_j$, is maximized throughout the entire executable list. Then, element $m(i, j)$ in M is permanently set to 0. All symbols throughout the reordered stream that are concatenated as $x_k x_{k+1}$, $x_k=a_i x_{k+1}=a_j$, are tagged such that subsequent iterations of the order-one method cannot insert any other core-instructions between them. In the subsequent iteration, the tags are considered when recomputing M by updating the dependency set $D(x)$ correspondingly.

The two acts of the order-one method are repeated until all elements of the connectivity matrix M are smaller than 2. An example of how the number of sequential occurrences of the most frequent core instruction in an instruction set changes after several iterations of the order-one method, is illustrated in FIG. 8.

The order-one method increases globally the probability that certain symbols appear after a given symbol. The order-one method is optimal for a PPM model of order 1. For higher orders, the order-one method is a greedy heuristic that performs well. The heuristic goal that the order-one method aims to achieve for higher order PPM models is sequencing of core-instructions into common contexts. The hope is that if common contexts exist in the program binary, the order-one method enforces their appearance.

A third way of determining a reordered sequence of instructions will be referred to herein as the "exhaustive search" method. The "exhaustive search" method is generally faster than the "order-one" method of rescheduling instructions. The aim of the exhaustive search method is to find local core instruction schedules that improve the prediction of the PPM model according to its current state. An advantage of the exhaustive search method over the order-one method is that the exhaustive search method adapts the instruction schedule to fit the current PPM model regardless of PPM's context order. A disadvantage of the exhaustive search method over the order-one method is that the exhaustive search method fails to recognize the global correlation of instruction sequences.

The exhaustive search method reschedules non-control-flow core instructions only within their basic block. For each basic block the exhaustive search method reschedules the core instructions exhaustively such that PPM emits a minimal number of escape symbols ϵ starting from its current model state. Since the number of different schedules in a basic block may potentially grow exponentially with respect to the number of instructions, large basic blocks into mini-blocks of limited cardinality (typically 10–15 core-instructions). Although this act puts an upper bound on algorithm complexity, it actually has little effect on the final results as instructions can rarely be moved significantly up and down in x386 code because of a small register file.

While three embodiment for rescheduling instructions has been described, the principles of the present invention are not so limited. It is the general novel concept of rescheduling instruction to improve sequential correlation between instructions that provides a significant improvement to the art of compressing binary instruction lists.

The third of the three pre-processing acts that improves compression is to assign a unique library to the most commonly appearing core instructions. When performing local sequential correlation (such as PPM compression) on a binary list of instructions, the local sequential correlation typically considers one byte at a time of the binary list. Each 8-bit value has a corresponding symbol (also called herein a "character") from a 256 symbol alphabet assigned to it. The local sequential correlation finds the corresponding symbol, and then feeds that symbol into the compression model. This occurs regardless of what field the 8-bit value was taken from.

In accordance with the principles of the present invention, a second alphabet of symbols is established that corresponds to the most frequently occurring core instructions. When performing local sequential correlation, if one of the frequently occurring core instructions is encountered, then the corresponding symbol from the addition alphabet is fed to the local sequential correlation model as the next incoming symbol. Otherwise, if the next value encountered in the binary list is not a core instruction, or is not one of the frequently occurring core instructions that has a corresponding symbol, then the corresponding symbol from the original alphabet is fed to the local sequential correlation model as the next incoming symbol.

The symbols within the local sequential correlation model thus provide information as to whether one of the frequently occurring instructions is encounter, not just what the one or more corresponding 8-bit value(s). For example, consider the instruction list 600 of FIG. 6 having three instructions. The left column includes the binary code 601 of the three instructions, while the right column includes the corresponding assembly language 602 for the binary code that appears to its immediate left when the binary code is interpreted in accordance with the X86 instruction set. The binary code that is within the box represents the portion of the instruction that represents the core operation (also called herein "core instruction").

Figure 6:
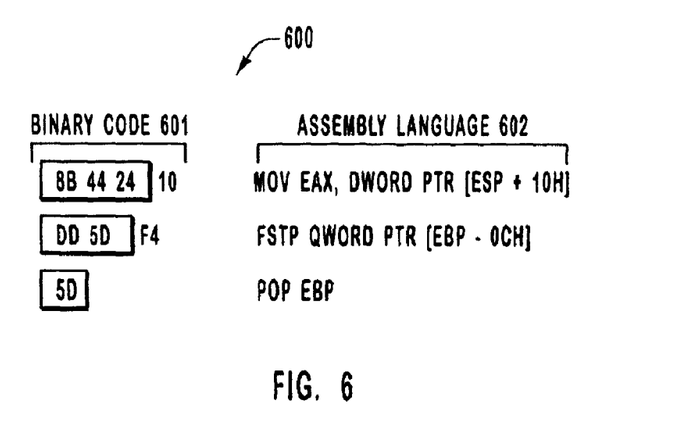
FIG. 6 illustrates several examples of binary code along with the corresponding assembly language.

The first instruction "8B 44 24 10" in an instruction that includes a core instruction "8B 44 24" that, for purposes of discussion, we shall assume frequently appears. Accordingly, the value "8B 44 24" would be replaced by a symbol from the additional alphabet when fed into the local sequential correlation model.

The second instruction "DD 5D F4" is an instruction that includes a core instruction "DD 5D" that does not occur frequently enough that it has its own symbol from the addition alphabet. Accordingly, the symbol from the original alphabet corresponding to the one byte value "DD" is first fed to the local sequential correlation model, followed by the symbol from the original alphabet corresponding to the one byte value "5D".

The third instruction "5D" is a core instruction in its entirety, and also is a core instruction that occurs frequently enough to have its own symbol from the additional alphabet. Accordingly, the value "5D" would be replaced by a symbol from the additional alphabet when fed into the local sequential correlation model.

Note that the symbol for 5D represented for the second instruction is different than the symbol from 5D represented for the third instruction. Accordingly, the use of the additional alphabet allows information regarding frequently occurring instructions to be considered when finding local sequential correlation. This improves compression rates since fields often have stronger local sequential correlation between the most frequently occurring core instructions as compared to the byte values that make up that core instruction.

In summary, the principles of the present invention improve compression rates by performing one or more of three pre-processing acts including instruction splitting, instruction rescheduling, and dual alphabet use for core instructions. Each of these pre-processing acts improves local sequential correlation. Accordingly, compression rates are reduced when the preprocessed instruction segments are fed to a compression mechanism such as PPM that relies on a high degree of local sequential correlation.

The principles of the present invention provide a significant improvement to the state of the art. Compression is widely employed to preserve memory and bandwidth. Even a small incremental improvement to compression technology saves enormous computational resources. PPMD and bzip2 are two compression technologies that are currently widely considered to be the best available compression technologies for compressing program binaries.

Figure 7:
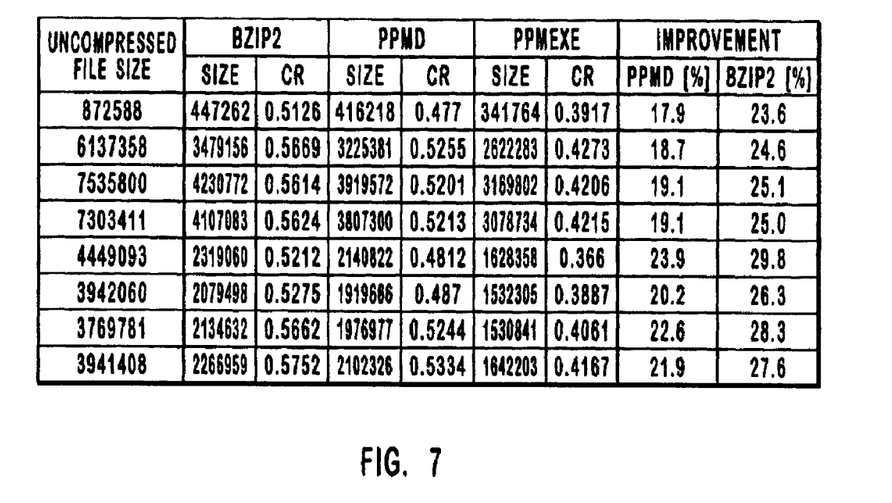
FIG. 7 illustrates a chart showing the improved compression performance using the principles of the present invention.

However, the inventors of the present invention have developed a working application that implements each of the pre-processing acts described above. In that working application, the instruction splitting pre-processing act splits the instructions into seven different segments. In addition, the two implemented alphabets each have 256 symbols when performing the dual alphabet pre-processing act. After performing the pre-processing acts, the PPM compression was performed with a maximum context of four. The working application that implements the principles of the present invention was compared to PPMD and bzip2 for 8 different executable files of different sizes. The results are illustrated in the table of FIG. 7. Note that under these conditions, the principles of the present invention improve compression rates by approximately 20% for PPMD, and approximately 25% for bzip2. This represents a vast leap in the art of compression technologies.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. In a processing system that has access to a sequential list of executable instructions, a method for compressing the executable instructions, the method comprising the following:

an act of extracting a plurality of portions from the sequential list of executable instructions, at least some of the extracted portions comprising one or more subportions of single executable instructions;

an act of compressing each of the plurality of portions using local sequential correlation compression to form a compressed version of each of the extracted portions; and an act of compressing a remainder portion of the sequential list of instructions that represents the portion of the sequential list of executable instructions that remained after extracting the plurality of portions.

2. A method in accordance with claim 1, wherein the act of extracting a plurality of portions from the sequential list of executable instructions comprises the following:

an act of extracting the plurality of portions non-uniformly from a plurality of executable instructions.

3. A method in accordance with claim 2, wherein the act of extracting the plurality of portions non-uniformly from a plurality of executable instructions comprises the following:

an act of determining that splitting a first portion from a second portion results in a lower compression ratio when using local sequential correlation compression than when compressing the combination of the first portion and the second portion using local sequential correlation compression; and an act of splitting the first portion from the second portion after the act of determining.

4. A method in accordance with claim 3, wherein the act of extracting the plurality of portions non-uniformly from a plurality of executable instructions comprises the following:

an act of determining that merging a third portion with a fourth portion results in a lower compression ratio when using local sequential correlation compression than when separately compressing the third portion and the fourth portion using local sequential correlation compression; and an act of merging the third portion from the fourth portion after the act of determining that merging the third portion with the fourth portion results in a lower compression ratio.

5. A method in accordance with claim 2, wherein the act of extracting the plurality of portions non-uniformly from a plurality of executable instructions comprises the following:

an act of determining that merging a first portion with a second portion results in a lower compression ratio when using local sequential correlation compression than when separately compressing the first portion and the second portion using local sequential correlation compression; and an act of merging the first portion from the second portion after the act of determining.

6. A method in accordance with claim 1, wherein the act of compressing each of the plurality of portions using local sequential correlation compression comprises the following:

an act of compressing each of the plurality of portions using Prediction by Partial Matching (PPM) compression.

7. A method in accordance with claim 1, wherein the act of compression the remainder portion comprises the following:

an act of compressing the remainder portion using PPM compression.

8. A method in accordance with claim 1, further comprising the following:

before the act of compressing the remainder portion, an act of determining a reordering of a sequence of instructions in the remainder instruction that would result in a lower compression ratio when using local sequential correlation compression; and an act of reordering a sequence of instructions in the remainder portion without losing dependencies between the sequence of instructions.

9. A method in accordance with claim 1, wherein the act of compressing the remainder instruction comprises the following:

an act of assigning additional symbols to represent some of the instruction segments that occur in the remaining portion; and an act of compressing the remainder portion using the additional symbols.

10. A computer program product for using in a processing system that has access to a sequential list of executable instructions, the computer program product for implementing a method for compressing the executable instructions, the computer program product comprising one or more computer-readable media having stored thereon the following:

computer-executable instructions for extracting a plurality of portions from the sequential list of executable instructions, at least some of the extracted portions comprising one or more subportions of single executable instructions;

computer-executable instructions for compressing each of the plurality of portions using local sequential correlation compression to form a compressed version of each of the extracted portions; and computer-executable instructions for compressing a remainder portion of the sequential list of instructions that represents the portion of the sequential list of executable instructions that remained after extracting the plurality of portions.

11. A computer program product in accordance with claim 10, wherein the one or more computer-readable media are physical storage media.

12. A computer program product in accordance with claim 10, wherein the computer-executable instructions for extracting a plurality of portions from the sequential list of executable instructions comprises the following:

computer-executable instructions for extracting the plurality of portions non-uniformly from a plurality of executable instructions.

13. A computer program product in accordance with claim 10, wherein the computer-executable instructions for extracting the plurality of portions non-uniformly from a plurality of executable instructions comprise the following:

computer-executable instructions for determining that splitting a first portion from a second portion results in a lower compression ratio when using local sequential correlation compression than when compressing the combination of the first portion and the second portion using local sequential correlation compression;

computer-executable instructions for splitting the first portion from the second portion after the act of determining.

14. A computer program product in accordance with claim 10, wherein the computer-executable instructions for extracting the plurality of portions non-uniformly from a plurality of executable instructions comprise the following:

computer-executable instructions for determining that merging a first portion with a second portion results in a lower compression ratio when using local sequential correlation compression than when separately compressing the first portion and the second portion using local sequential correlation compression; and computer-executable instructions for merging the first portion with the second portion after determining that merging a first portion with a second portion results in a lower compression ratio.

15. In a processing system that has access to a sequential list of executable instructions, a method for compressing the executable instructions, the method comprising the following:

an act of accessing the sequential list of executable instructions;

a step for compressing the sequential list of executable instructions so as to reduce the compression ratio.

16. A method in accordance with claim 15, wherein the step for compressing the sequential list of executable instructions so as to reduce the compression ratio comprises the following:

an act of extracting a plurality of portions from the sequential list of executable instructions, at least some of the extracted portions comprising one or more subportions of single executable instructions;

an act of compressing each of the plurality of portions using local sequential correlation compression to form a compressed version of each of the extracted portions; and an act of compressing a remainder portion of the sequential list of instructions that represents the portion of the sequential list of executable instructions that remained after extracting the plurality of portions.

17. In a processing system that has access to a sequential list of executable instructions, a method for decompressing the executable instructions, the method comprising the following:

an act of decompressing each of a plurality of portions extracted from a sequential list of executable instructions using local sequential correlation decompression;

an act of decompressing a remainder portion of the sequential list of instructions that represents the portion of the sequential list of executable instructions that remained after extracting the plurality of portions; and an act of aggregating the decompressed form of the plurality of extracted portions and the remainder portion to reconstruct the sequential list of computer executable instructions.

18. A method in accordance with claim 17, wherein the plurality of portions are non-uniform across a plurality of executable instructions.

19. A computer program product of use in a processing system that has access to a sequential list of executable instructions, the computer program product for implementing a method for decompressing the executable instructions, the computer program product comprising one or more computer-readable media having stored thereon the following:

computer-executable instructions for decompressing each of a plurality of portions extracted from a sequential list of executable instructions using local sequential correlation decompression;

computer-executable instructions for decompressing a remainder portion of the sequential list of instructions that represents the portion of the sequential list of executable instructions that remained after extracting the plurality of portions;

computer-executable instructions for aggregating the decompressed form of the plurality of extracted portions and the remainder portion to reconstruct the sequential list of computer executable instructions.

20. A computer program product in accordance with claim 19, wherein the one or more computer-readable media are physical storage media.

21. In a processing system that has access to a sequential list of instructions in an original sequence, a method for compressing the instructions, the method comprising the following:

an act of determining a reordered sequence of instructions that performs the identical operations as the original sequence of instructions, and which results in a smaller compression ratio when performing local sequential correlation compression as compared to the original sequence of instructions; and an act of compressing the reordered sequence of instructions using local sequential correlation compression.

22. A method in accordance with claim 21, wherein the act of determining a reordered sequence of instructions comprises the following:

an act of identifying a range that a given instruction may be reordered within;

an act of testing a reordering of the given instruction to a plurality of locations within the range; and an act of identifying a reordered position within the range that results in no loss of dependencies and that results in a lower compression ratio using local sequential correlation compression.

23. A computer program product for use in a processing system that has access to a sequential list of instructions in an original sequence, the computer program product for implementing a method for compressing the instructions, the computer program product comprising one or more computer-readable media having stored thereon the following:

computer-executable instructions for determining a reordered sequence of instructions that performs the identical operations as the original sequent of instructions, and which results in a smaller compression ratio when performing local sequential correlation compression as compared to the original sequence of instructions; and computer-executable instructions for compressing the reordered sequence of instructions using local sequential correlation compression.

24. A computer program product in accordance with claim 23, wherein the one or more computer-readable media are physical storage media.

25. In a processing system that has access to a sequential list of instructions in an original sequence, a method for compressing the instructions, the method comprising the following:

an act of assigning symbols to represent one or more instruction segments that occur in the sequential list of instructions; and an act of performing local sequential correlation compression by using the symbols in place of the corresponding instruction segments where they occur.

26. A method in accordance with claim 25, wherein the act of performing local sequential correlation compression comprises using PPM compression.

* * * * *